United States Patent
Chen

(10) Patent No.: US 7,800,125 B2
(45) Date of Patent: Sep. 21, 2010

(54) LIGHT-EMITTING DIODE PACKAGE

(75) Inventor: Chun-Min Chen, Tainan County (TW)

(73) Assignee: Himax Display, Inc., Tainan County (TW)

( * ) Notice: Subject to any disclaimer, the term of this patent is extended or adjusted under 35 U.S.C. 154(b) by 68 days.

(21) Appl. No.: 12/170,137

(22) Filed: Jul. 9, 2008

(65) Prior Publication Data
US 2010/0006877 A1 Jan. 14, 2010

(51) Int. Cl.
*F21S 6/00* (2006.01)
(52) U.S. Cl. .................. 257/98; 257/E25.02; 362/257; 362/231
(58) Field of Classification Search ............ 257/E25.02; 362/257, 231, 521, 336; 349/742, 743
See application file for complete search history.

(56) References Cited

U.S. PATENT DOCUMENTS

| 6,586,096 | B2 * | 7/2003 | Border et al. ............... 428/402 |
| 7,066,626 | B2 * | 6/2006 | Omata ........................ 362/257 |
| 7,553,683 | B2 * | 6/2009 | Martin et al. ................. 438/29 |
| 2005/0286145 | A1 * | 12/2005 | Silhengst et al. ............ 359/742 |
| 2007/0152231 | A1 | 7/2007 | Destain |
| 2007/0268694 | A1 * | 11/2007 | Bailey et al. ................ 362/231 |

* cited by examiner

*Primary Examiner*—A. Sefe
*Assistant Examiner*—Allen L Parker
(74) *Attorney, Agent, or Firm*—J.C. Patents

(57) ABSTRACT

An LED package including a carrier, a LED chip, and a lens is provided. The LED chip is disposed on the carrier. The lens is disposed on the carrier and above the LED chip. A gap is formed between the LED chip and the lens. The lens has a first surface, a second surface, a protrusion, and at least one protruding ring. The first surface faces the LED chip. The second surface is opposite to the first surface. The protrusion is located at the first surface. The protruding ring is located at the first surface and surrounds the protrusion.

12 Claims, 8 Drawing Sheets

LIGHT-EMITTING DIODE PACKAGE

BACKGROUND OF THE INVENTION

1. Field of the Invention

The present invention generally relates to a light source and, in particular, to a light-emitting diode (LED) package.

2. Description of Related Art

As the luminous efficiency of light emitting diodes (LEDs) is increasingly improved, LEDs have replaced fluorescent lamps and incandescent lamps in some fields, for example, lamps of scanners requiring for quick response, lamps of projection apparatus, backlight sources or front light sources of liquid crystal displays (LCDs), illumination for dashboards of automobiles, traffic lights, common illumination devices, etc. Compared with conventional lamps, the LEDs have absolute advantages, for example, small volume, long lifespan, low driving voltage/current, non-fragile, mercury free (no pollution), and good luminous efficiency (power saving).

FIG. 1 is a schematic structural view of a conventional LED package. Referring to FIG. 1, the conventional LED package 100 includes an LED chip 110, a lead frame 120, and an encapsulant 130. The LED chip 110 is disposed on the lead frame 120 and electrically connected therewith. The encapsulant 130 wraps the LED chip 110 and a part of the lead frame 120 for protecting the LED chip 110. The encapsulant 130 has a convex top surface 132 for preventing the total internal reflection (TIR) of the beam 112 emitted from the LED chip 110 due to the interface between the encapsulant 130 and air.

FIG. 2 is a schematic structural view of another conventional LED package. Referring to FIG. 2, the other conventional LED package 200 includes an LED chip 210, a circuit board 220, and an encapsulant 230. The LED chip 210 is disposed on the circuit board 220 and electrically connected therewith. The encapsulant 230 is disposed on the circuit board 220 and wraps the LED chip 210. The encapsulant 230 also has a convex top surface for preventing the TIR of the beam 212 emitted from the LED chip 210.

However, referring to FIGS. 1 and 2, the range of the light emitting angle θ1 and θ2 of the conventional LED packages 100 and 200 is large, approximate to 180 degrees, such that the LED packages 100 and 200 are not suitable for illuminating distant objects. For example, when the LED package 100 or 200 is applied as a light source in the projection apparatus (not shown), the beam 112 or 212 is hard to be mostly converged on the light valve (not shown) of the projection apparatus, such that the brightness of the light valve is not enough.

SUMMARY OF THE INVENTION

Accordingly, the present invention is directed to a light-emitting diode (LED) package, which has a small range of a light emitting angle.

According to an embodiment of the present invention, an LED package including a carrier, a LED chip, and a lens is provided. The LED chip is disposed on the carrier. The lens is disposed on the carrier and above the LED chip. A gap is formed between the LED chip and the lens. The lens has a first surface, a second surface, a protrusion, and at least one protruding ring. The first surface faces the LED chip. The second surface is opposite to the first surface. The protrusion is located at the first surface. The protruding ring is located at the first surface and surrounds the protrusion.

In the LED package according to the embodiments of the present invention, since the gap is formed between the LED chip and the lens and has different refractive index from that of the lens, and since the lens has the protrusion and the protruding ring, the range of the light emitting angle of the light from the second surface of the lens is reduced.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
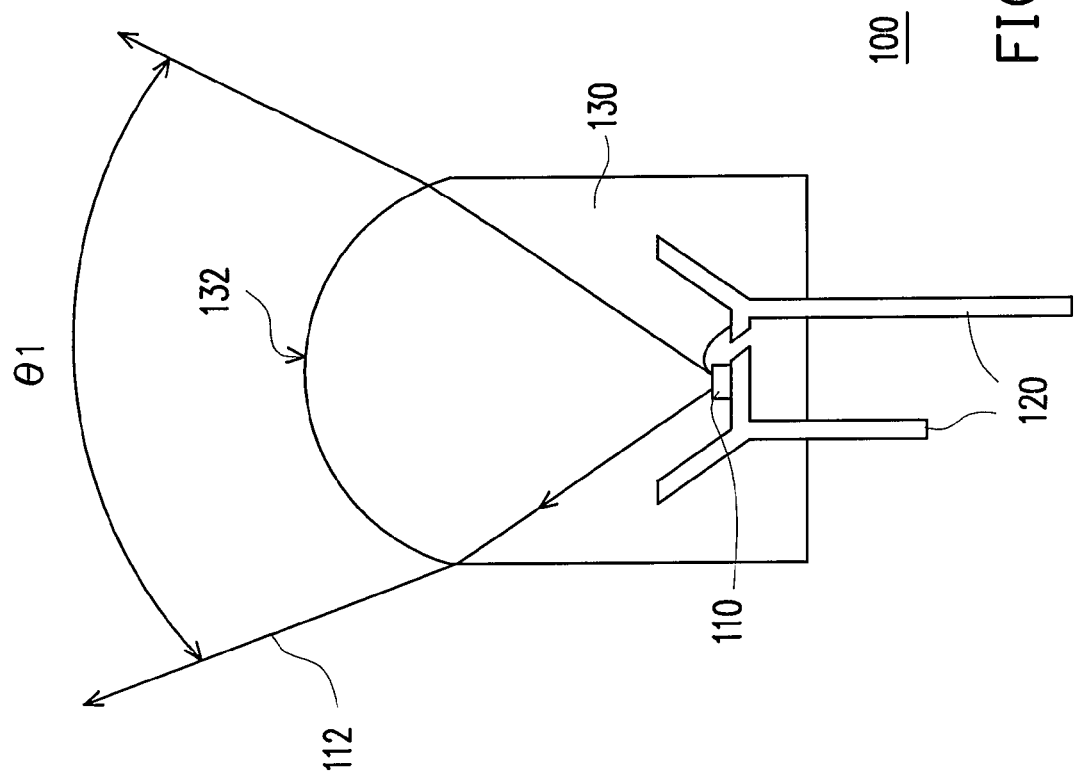
FIG. 1 is a schematic structural view of a conventional LED package.
Figure 2:
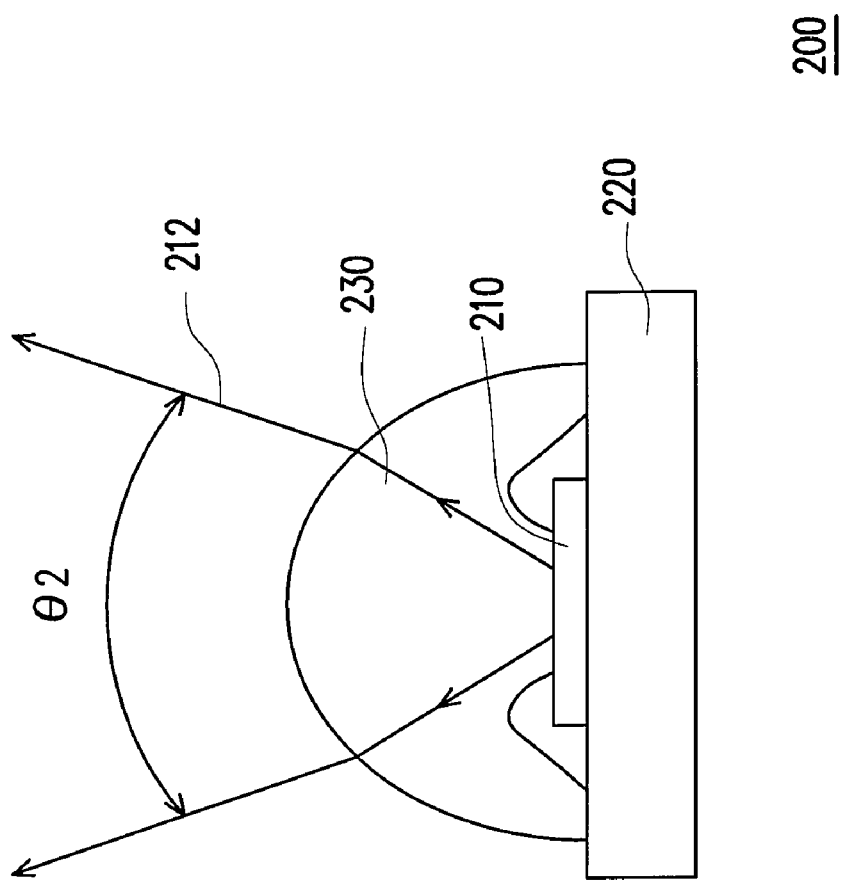
FIG. 2 is a schematic structural view of another conventional LED package.

Reference will now be made in detail to the present embodiments of the invention, examples of which are illustrated in the accompanying drawings. Wherever possible, the same reference numbers are used in the drawings and the description to refer to the same or like parts.

First Embodiment

Figure 3A:
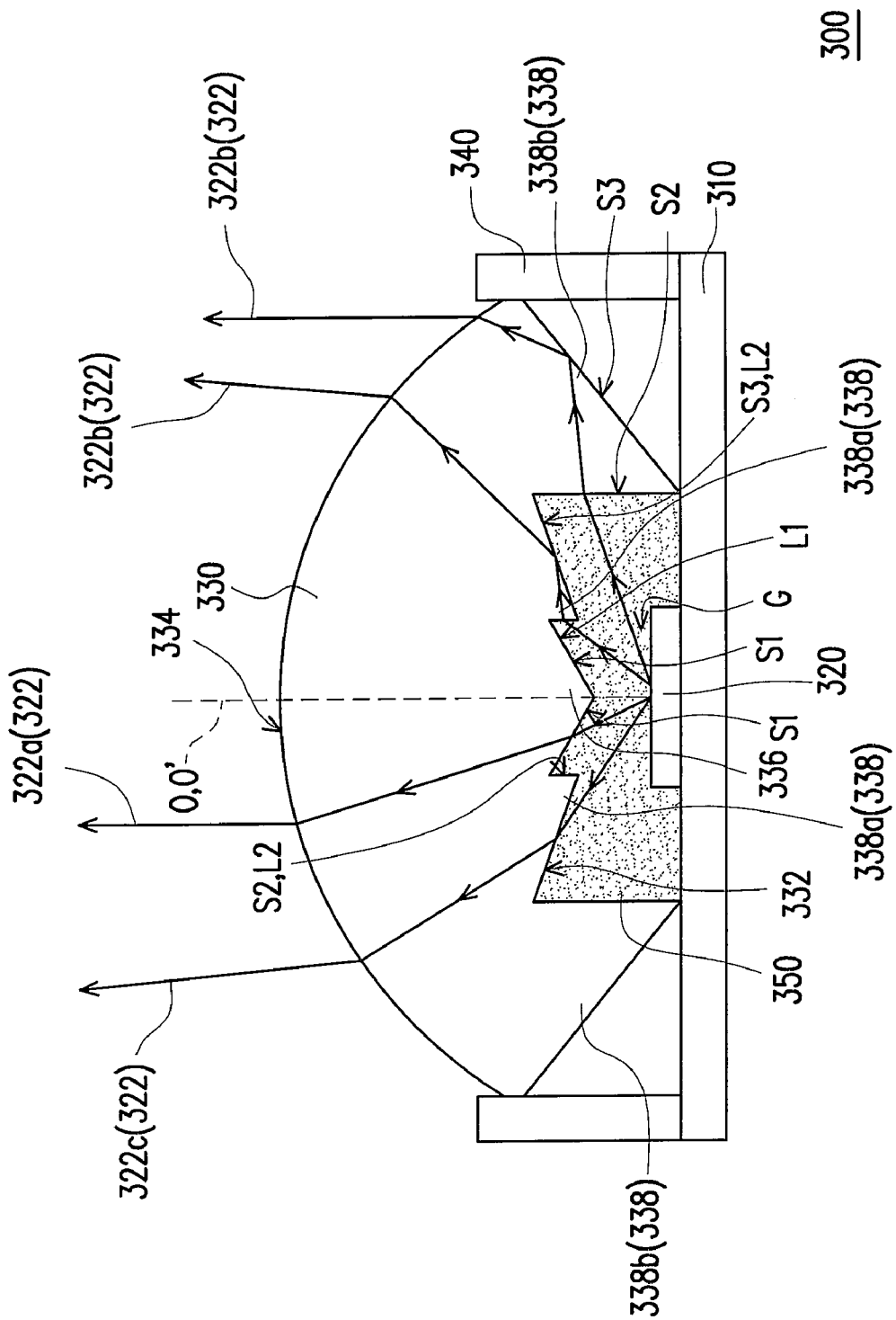
FIG. 3A is a schematic cross-sectional view of a light-emitting diode (LED) package according to a first embodiment of the present invention.
Figure 3B:
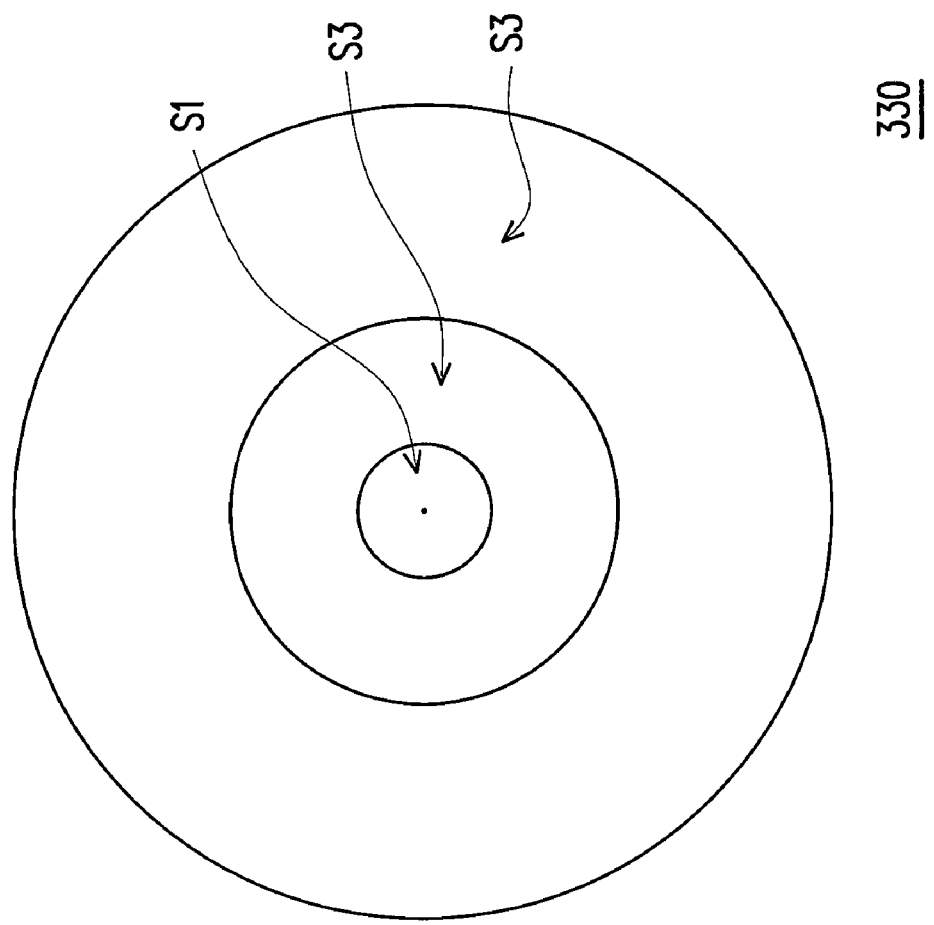
FIG. 3B is a schematic bottom view of a lens in FIG. 3A.

FIG. 3A is a schematic cross-sectional view of a light-emitting diode (LED) package according to a first embodiment of the present invention, and FIG. 3B is a schematic bottom view of a lens in FIG. 3A. Referring to FIGS. 3A and 3B, the LED package 300 of the present embodiment includes a carrier 310, a LED chip 320, and a lens 330. The LED chip 320 is disposed on the carrier 310. In the present embodiment, the carrier 310 is, for example, a circuit substrate. However, in other embodiment (not shown), the carrier may be a lead frame or other appropriate carrier. The lens 330 is disposed on the carrier 310 and above the LED chip 320. In the present embodiment, the LED package 300 further includes a supporter 340 disposed around the LED chip 320 and connecting the carrier 310 and the lens 330 for supporting the lens 330. A gap G is formed between the LED chip 320 and the lens 330. In the present embodiment, a minimum distance between the lens 330 and the LED chip 320 is greater than 0, and is less than or equal to 3 millimeters. Additionally, in the present embodiment, the gap G is filled in with an encapsulant 350. The material of the encapsulant 350 may includes resin or other light transmissive material, and the refractive index of the lens 330 may be greater than that of the encapsulant. More particularly, the material of the encapsulant 350 is, for example, silicone. However, in other embodiments (not shown) the gap may be filled in with gas or air, or the gap may be a vacuum gap.

The lens 330 has a first surface 332, a second surface 334, a protrusion 336, and a plurality of protruding rings 338, such as the protruding rings 338a and 338b. The first surface 332 faces the LED chip 320. The second surface 334 is opposite to the first surface 332. The protrusion 336 is located at the first surface 332. Each of the protruding rings 338 is located at the first surface 332 and surrounds the protrusion 336. In more detail, the protruding ring 338b surrounds the protruding ring 338a, and the protruding ring 338a surrounds the protrusion 336. In the present embodiment, the protrusion 336 has a first subsurface S1, and each of the protruding rings 338 has a second subsurface S2 and a third subsurface S3. The second subsurface S2 surrounds the first subsurface S1, and the third subsurface S3 is connected with and surrounds the second subsurface S2.

The LED chip 320 is adapted to emit a beam 322 passing through the lens 330. In the present embodiment, the lens 330 is rotational symmetrical with respect to an optical axis O. Additionally, in the present embodiment, the second surface 334 is a curved surface protruding away from the LED chip 320. More particularly, the second surface 334 is, for example, a spherical surface, a non-spherical surface, or other curved surface. Any one cross-section of the first subsurface S1 formed by cutting the lens 330 along the optical axis O' of the beam 322 includes two straight lines L1 connected to each other and is V-shaped, and any cross-sections of the second and third subsurfaces S2, S3 of each protruding ring 338 formed by cutting the lens 330 along the optical axis O' of the beam 322 includes a plurality of straight lines L2.

In the present embodiment, a first part of the beam 322a passes through the first subsurface S1 and the second surface 334 in sequence. Moreover, a plurality of second parts of the beam 322b respectively pass through the second subsurfaces S2 of the protruding rings 338, are respectively totally internally reflected by the third subsurfaces S3 of the protruding rings 338, and pass through the second surface 334 in sequence. In addition, a plurality of third parts of the beam 322c pass through the third subsurface S3 of protruding ring 338a and the second surface 334 in sequence. Additionally, in the present embodiment, the included angle made by the first part of the beam 322a emitted from the second surface 334 and the optical axis O falls within a range from 0 degree to 60 degrees.

In the LED package 300 of the present embodiment, since the gap G is formed between the LED chip 320 and the lens 330 and has different refractive index from that of the lens 330, and since the lens 330 has the protrusion 336 and the protruding rings 338 for distributing the beam 322, the range of the light emitting angle of the beam 322 from the second surface 334 of the lens is reduced. In this way, when the LED package 300 is applied in a projection apparatus (not shown), the beam 322 from the LED package 300 is able to be converged on the light valve (not shown) of the projection apparatus, such that the optical efficiency is increased, and the image frames projected by the projection apparatus may be brighter.

It should be noted that the number of the LED chip 320 of the LED package 300 is not limited to one. In other embodiments (not shown), the LED chip 320 may be replaced by a plurality of LED chips which are, for example, arranged in an array.

Second Embodiment

Figure 4A:
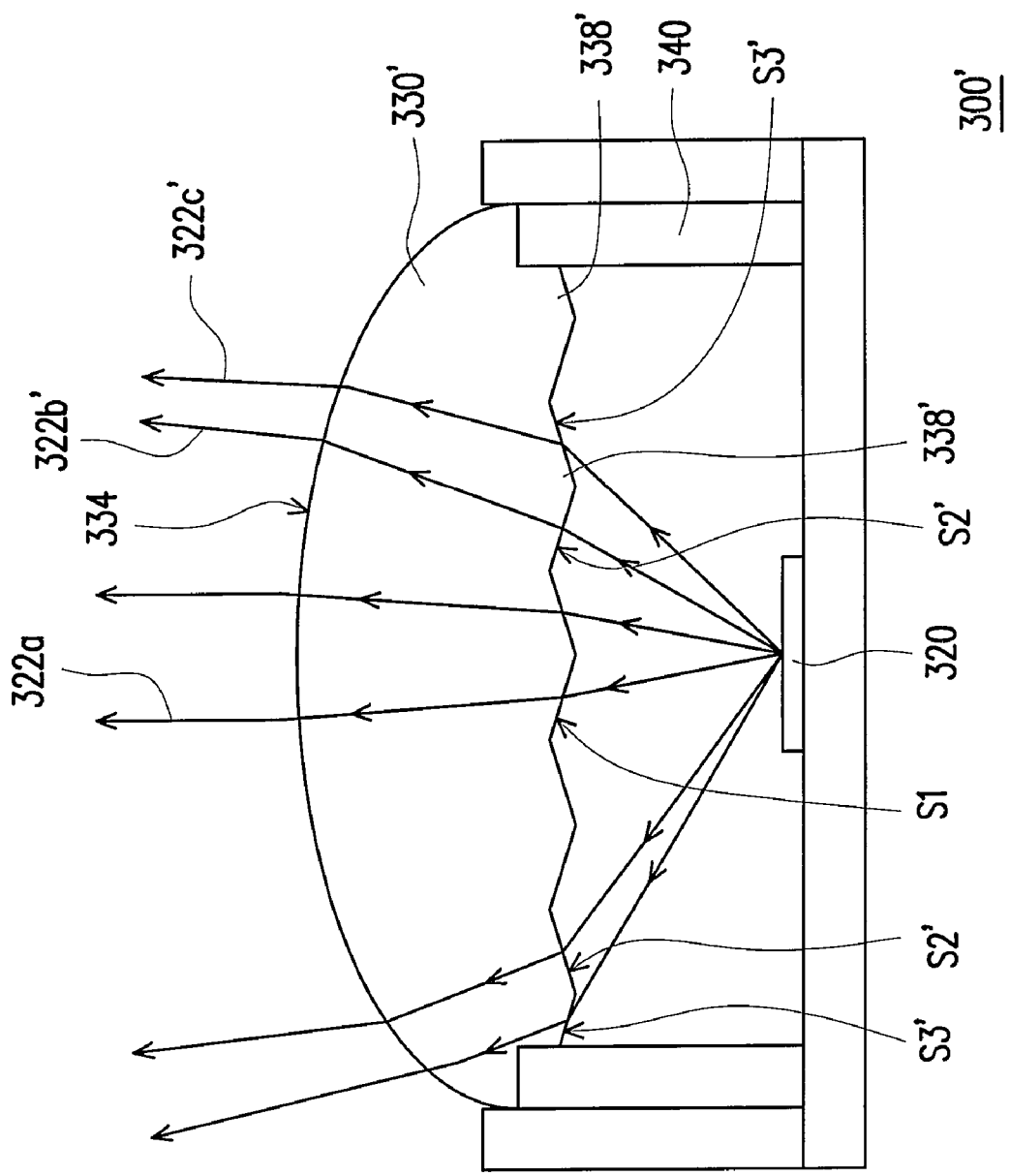
FIG. 4A is a schematic cross-sectional view of an LED package according to a second embodiment of the present invention.
Figure 4B:
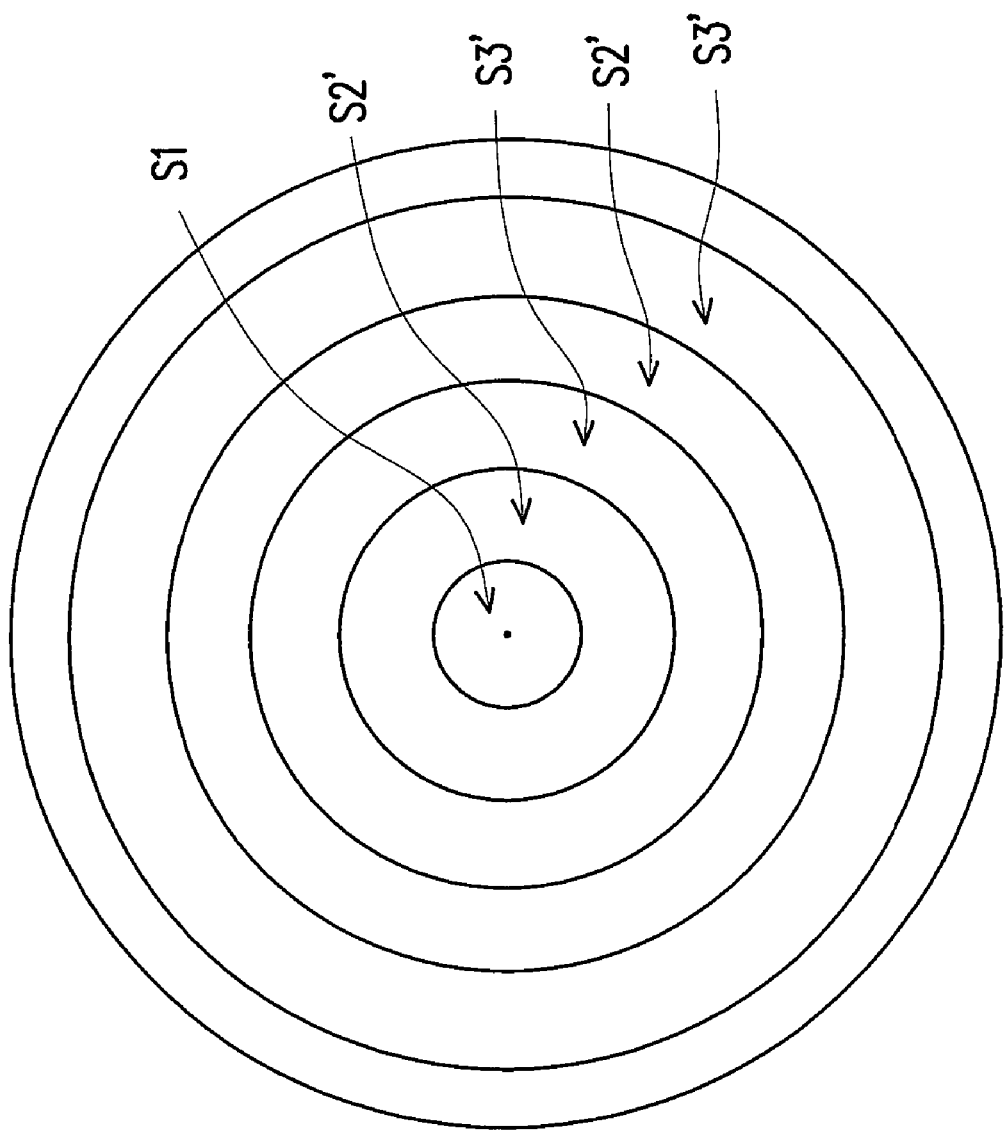
FIG. 4B is a schematic bottom view of a lens in FIG. 4A.

FIG. 4A is a schematic cross-sectional view of an LED package according to a second embodiment of the present invention, and FIG. 4B is a schematic bottom view of a lens in FIG. 4A. Referring to FIGS. 4A and 4B, the LED package 300' is similar to the above LED package 300 in FIG. 3A, but the differences therebetween are as follows. In the LED package 300', the first part of the beam 322a passes through the first subsurface S1 and the second surface 334 in sequence. In addition, a second part of the beam 322b' passes through a second subsurface S2' of each protruding ring 338' of a lens 330' and the second surface 334 thereof in sequence. Moreover, a third part of the beam 322c' passes through the third subsurface S3' of each protruding ring 338' and the second surface 334 in sequence. In other words, there occurs no TIR on the protruding ring 338'.

Third Embodiment

Figure 5A:
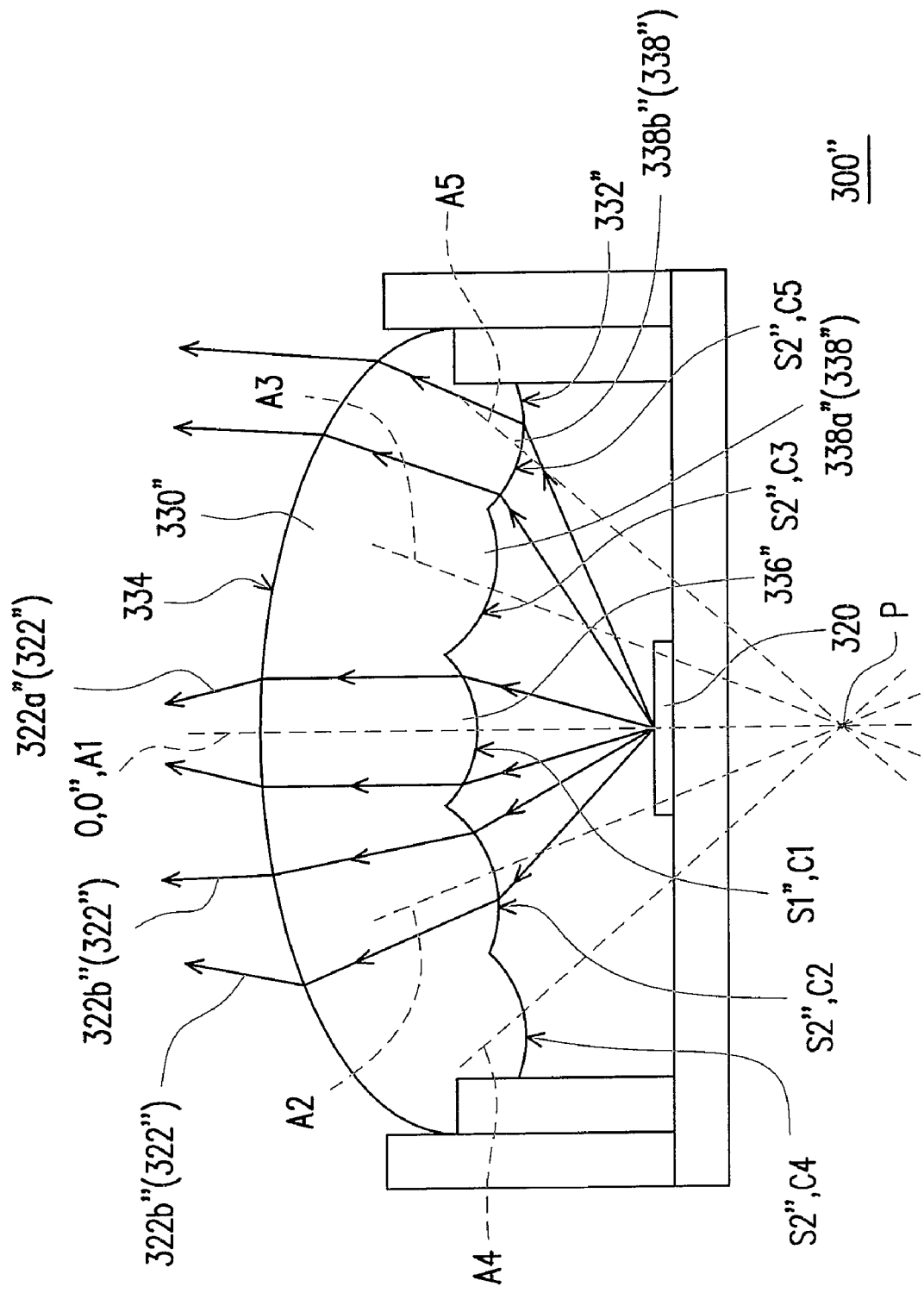
FIG. 5A is a schematic cross-sectional view of an LED package according to a third embodiment of the present invention.
Figure 5B:
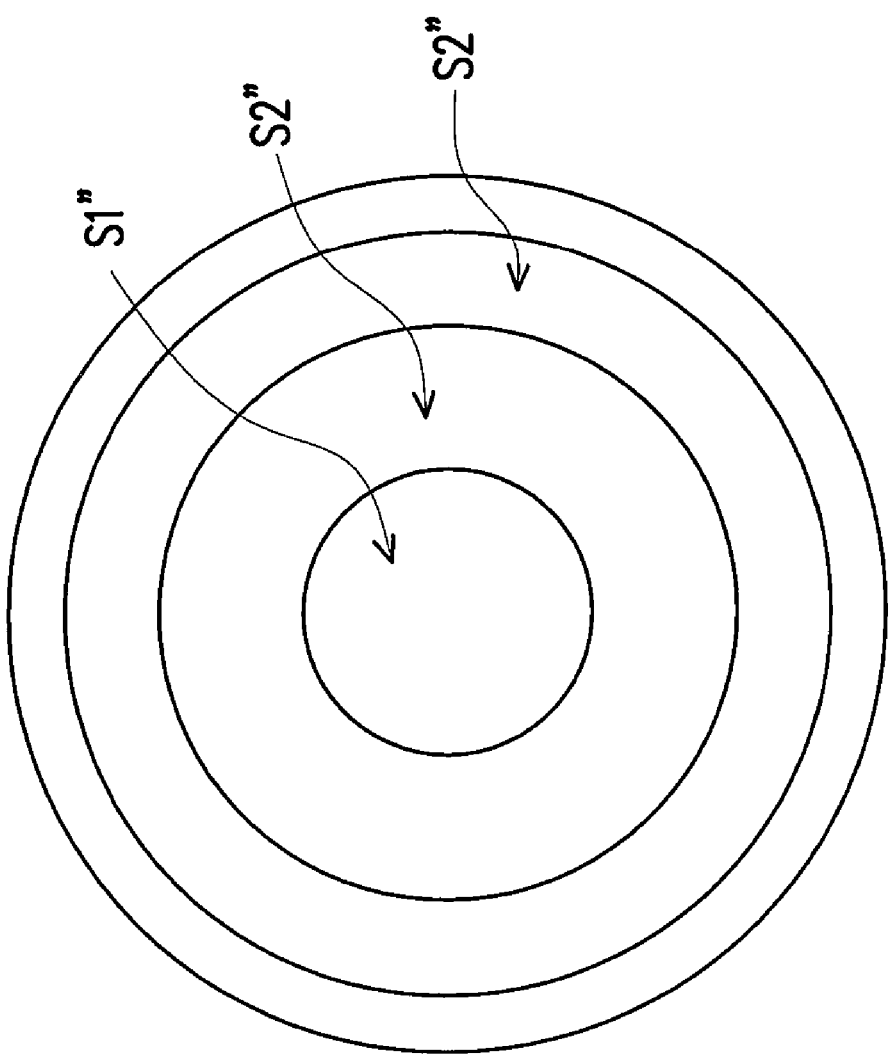
FIG. 5B is a schematic bottom view of a lens in FIG. 5A.

FIG. 5A is a schematic cross-sectional view of an LED package according to a third embodiment of the present invention, and FIG. 5B is a schematic bottom view of a lens in FIG. 5A. Referring to FIGS. 5A and 5B, the LED package 300" of the present embodiment is similar to the above LED package 300' in FIG. 4A, but the differences therebetween are as follows. In the LED package 300", a protrusion 336" has a first subsurface S1", and each of the protruding rings 338", such as the protruding rings 338a" and 338b", has a second subsurface S2" surrounding the first subsurface S1". Any one cross-section of the first subsurface S1" formed by cutting the lens 330" along the optical axis O" of the beam 322" is a first curved line C1, and any one cross-section of the second subsurfaces S2" of the protruding rings 338" formed by cutting the lens 330" along the optical axis O" of the beam 322" includes a second curved line C2, a third curved line C3, a fourth curved line C4, and a fifth curved line C5, wherein the second curved line C2 and the third curved line C3 belong to the protruding ring 338a", and the fourth curved line C4 and the fifth curved line C5 belong to the protruding ring 338b".

In the present embodiment, a first symmetric axis A1 of the first curved line C1, a second symmetric axis A2 of the second curved line C2 of the protruding ring 338a", a third symmetric axis A3 of the third curved line C3 of the protruding ring 338a", a fourth symmetric axis A4 of the fourth curved line C4 of the protruding ring 338b", and a fifth symmetric axis A5 of the fifth curved line C5 of the protruding ring 338B" are not parallel to one another. More particularly, in the present embodiment, any two of the first symmetric axis A1, the second symmetric axis A2, the third symmetric axis A3, the fourth symmetric axis A4, and the fifth symmetric axis A5 intersect at a point P, and the first surface 332" is located between the point P and the second surface 334. A first part of the beam 322a" passes through the first subsurface S1" and the second surface 334 in sequence, and a second part of the beam 322b" passes through the second subsurface S2" of each protruding ring 338" and the second surface 334 in sequence. The protrusion 336" and the protruding ring 338" has the effect of converging the beam 322".

To sum up, in the LED package according to the embodiments of the present invention, since the gap is formed between the LED chip and the lens and has different refractive index from that of the lens, and since the lens has the protrusion and the protruding ring for distributing the beam, the range of the light emitting angle of the beam from the second surface of the lens is reduced. In this way, when the LED package is applied in a projection apparatus, the beam from the LED package is able to be converged on the light valve of the projection apparatus, such that the optical efficiency is increased, and the image frames projected by the projection apparatus may be brighter.

Additionally, since the beam is distributed by the protrusion and the protruding ring, the bonding wire, when the LED chip is electrically connected to the carrier by wire bonding, may not from an image on the light valve of the projection apparatus, which increases the uniformity of the image frames projected by the projection apparatus. In the LED package according to the embodiments of the present invention using the LED chips arranged in an array, the gaps between any two adjacent LED chips may not form an image on the light valve, which also increases the uniformity of the image frames projected by the projection apparatus.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A light-emitting diode (LED) package comprising:
   a carrier;
   a LED chip disposed on the carrier; and
   a lens disposed on the carrier and above the LED chip, a gap is formed between the LED chip and the lens, the lens having:
   a first surface facing the LED chip;
   a second surface opposite to the first surface;
   a protrusion located at the first surface and on an optical axis of the lens, wherein the protrusion has a first subsurface; and
   at least one protruding ring located at the first surface and surrounding the protrusion, wherein the at least one protruding ring has:
   a second subsurface surrounding the first subsurface; and
   a third subsurface connected with and surrounding the second subsurface;
   wherein the LED chip is adapted to emit a beam, wherein a first part of the beam passes through the first subsurface and the second surface in sequence, wherein a second part of the beam passes through the second subsurface, is totally internally reflected by the third subsurface, and passes through the second surface in sequence, and wherein a third part of the beam passes through the third subsurface and the second surface in sequence.

2. The LED package according to claim 1, wherein the lens has an optical axis, the included angle made by the first part of the beam emitted from the second surface and the optical axis falls within a range from 0 degree to 60 degrees.

3. The LED package according to claim 1, wherein the LED chip is adapted to emit a beam, wherein a first part of the beam passes through the first subsurface and the second surface in sequence, wherein a second part of the beam passes through the second subsurface and the second surface in sequence, and wherein a third part of the beam passes through the third subsurface and the second surface in sequence.

4. The LED package according to claim 1, wherein the LED chip is adapted to emit a beam passing through the lens, any one cross-section of the first subsurface formed by cutting the lens along the optical axis of the beam comprises two straight lines connected to each other and is V-shaped, and any cross-sections of the second and third subsurfaces formed by cutting the lens along the optical axis of the beam comprises a plurality of straight lines.

5. The LED package according to claim 1, wherein the second surface is a curved surface protruding away from the LED chip.

6. The LED package according to claim 1, wherein a minimum distance between the lens and the LED chip is greater than 0, and the minimum distance is less than or equal to 3 millimeters.

7. The LED package according to claim 1 further comprising a supporter disposed around the LED chip and connecting the carrier and the lens for supporting the lens.

8. The LED package according to claim 1 further comprising an encapsulant filled in the gap between the LED chip and the lens.

9. The LED package according to claim 8, wherein the refractive index of the lens is greater than the refractive index of the encapsulant.

10. The LED package according to claim 8, wherein the material of the encapsulant comprises resin.

11. The LED package according to claim 1, wherein gas or air is filled in the gap between the LED chip and the lens.

12. The LED package according to claim 1, wherein the lens is rotational symmetrical with respect to an optical axis.

* * * * *